(12) United States Patent
Horch et al.

(10) Patent No.: US 12,082,403 B1
(45) Date of Patent: Sep. 3, 2024

(54) ONE TIME PROGRAMMABLE BITCELL WITH SELECT DEVICE IN ISOLATED WELL

(71) Applicant: Synopsys, Inc., Sunnyvale, CA (US)

(72) Inventors: Andrew Edward Horch, Seattle, WA (US); Oleg Ivanov, Ottawa (CA); Larry Wang, San Jose, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/849,413

(22) Filed: Jun. 24, 2022

Related U.S. Application Data

(60) Provisional application No. 63/214,726, filed on Jun. 24, 2021.

(51) Int. Cl.
*G11C 17/16* (2006.01)
*G11C 17/18* (2006.01)
*H01L 23/525* (2006.01)
*H10B 20/20* (2023.01)

(52) U.S. Cl.
CPC .......... *H10B 20/20* (2023.02); *G11C 17/16* (2013.01); *G11C 17/18* (2013.01); *H01L 23/5252* (2013.01)

(58) Field of Classification Search
CPC ............................. G11C 17/16; H10B 20/20
USPC ................................................. 365/230.03
See application file for complete search history.

(56) References Cited

U.S. PATENT DOCUMENTS

| | | | |
|---|---|---|---|
| 7,532,496 B1 * | 5/2009 | Bu .................. | G11C 17/16 365/150 |
| 9,953,990 B1 | 4/2018 | Horch et al. | |
| 10,032,784 B2 | 7/2018 | Horch et al. | |
| 10,777,288 B2 | 9/2020 | Kurjanowicz | |
| 2012/0201072 A1 | 8/2012 | Seshadri et al. | |
| 2016/0012905 A1 * | 1/2016 | Chang .............. | G11C 11/5628 365/185.02 |
| 2020/0051653 A1 | 2/2020 | Kurjanowicz | |
| 2023/0297283 A1 * | 9/2023 | Alam ................ | G06F 3/0673 711/104 |

* cited by examiner

*Primary Examiner* — Muna A Techane
(74) *Attorney, Agent, or Firm* — Weaver Austin Villeneuve & Sampson LLP

(57) ABSTRACT

A semiconductor memory includes, in part, M×N select transistors disposed along M rows and N columns, where M and N are integers greater than or equal to 2. The memory further includes, in part, a first set of M wells each configured to be biased independently of the remaining M−1 wells. Each well has formed therein N of the select transistors each having a source/drain terminal coupled to the same bitline corresponding to a different one of M bitlines of the memory. The memory further includes, in part, M×N anti-fuses. Each anti-fuse is associated and forms a bitcell with a corresponding one of the M×N select transistors.

20 Claims, 14 Drawing Sheets

| | BL (PROG / Inhibit) | WL Selected | WL Unselected | CL Selected | CL Unselected | Select PW (PROG / Inhibit) | DNW |
|---|---|---|---|---|---|---|---|
| Read | 0V | VDD | 0V | Vread | 0V | 0V | 0V |
| Read Unselected | 0V | 0V | 0V | 0V | 0V | 0V | 0V |
| PROG / Inhibit | 0V / Vinhibit | >Vinhibit | ≥VDD | Vrupt | 0V | 0V / ≥VDD | ≥VDD |
| PROG Unselected | 0V / Vinhibit | ≥VDD | ≥VDD | ≥VDD | ≥VDD | ≥VDD | ≥VDD |

FIG. 3

| | BL (PROG / Inhibit) | WL Selected | WL Unselected | Anti-Fuse Selected (CL0) | Anti-Fuse Unselected (CL1) | PW (PROG / Inhibit) | DNW |
|---|---|---|---|---|---|---|---|
| Read Selected | 0V | VDDIO | 0V | Vread | 0V | 0V | 0V or VDD |
| Read Unselected | 0V | VDDIO | 0V | 0V | 0V | 0V | 0V or VDD |
| PROG Selected | 0V / Vinhibit | >Vinhibit | 0V | Vrupt | float or VDD | 0V / VDD | VDD |
| PROG Unselected | 0V / Vinhibit | VDD | VDD (reduced GIDL) | float or VDD | float or VDD | VDD | VDD |

*FIG. 8*

| | BL (PROG / Inhibit) | WL Selected | WL Unselected | CL Selected (PW CL0) | CL Unselected (PW CL1) | CL DNW | Select PW (PROG / Inhibit) |
|---|---|---|---|---|---|---|---|
| Read Selected | Vread | VDDIO | 0V | 0V | 0V | Vread | 0V |
| Read Unselected | Vread | 0V | 0V | 0V | 0V | Vread | 0V |
| PROG / Inhibit | 0V / Vinhibit | >Vinhibit | VDD | Vrupt | 0V | Vrupt | 0V / VDD |
| PROG Unselected | 0V / Vinhibit | VDD | VDD | VDD | VDD | Vrupt | VDD |

FIG. 11

| | BL | WL Selected | WL Unselected | CL Selected (NW Fuse0) | CL Unselected (NW Fuse1) | PW |
|---|---|---|---|---|---|---|
| Read Selected | 0V | VDDIO | 0V | Vread | 0V | 0V |
| Read Unselected | 0V | 0V | 0V | Vread | 0V | 0V |
| PROG | 0V | >Vinhibit | VDD | Vrupt | 0V | 0V |
| PROG Inhibit | Vinhibit | >Vinhibit | VDD | Vrupt | 0V or VDD | VDD |

*FIG. 13*

ONE TIME PROGRAMMABLE BITCELL WITH SELECT DEVICE IN ISOLATED WELL

RELATED APPLICATION

The present application claims benefit under 35 USC 119(e) of U.S. Patent Application No. 63/214,726, filed Jun. 24, 2021, the content of which is incorporated herein by reference in its entirety.

TECHNICAL FIELD

The present disclosure relates to programmable semiconductor memories, and more particularly to a one time programmable bitcell with select devices formed in isolated wells.

BACKGROUND

A one-time programmable (OTP) memory is a type of non-volatile memory (NVM) in which data may be written only once. After the memory has been programmed, it retains its value upon loss of power (e.g., it is non-volatile). An OTP often includes a two-dimensional array of bitcells that may be programmed using anti-fuses. An OPT has a relatively low power consumption and a small footprint.

Fin field-effect transistor (FinFET) processes have a number of layout rules and characteristics that prevent typical OTP anti-fuse bitcells from being scaled down. For example, such layout rules prevent devices with relatively thin and thick gate oxides to be formed in the same well, same diffusion, or placed near each other. Consequently, a two-transistor (2T) bitcell with an input/output (I/O) select device and an anti-fuse core device cannot be formed to share a common strip of diffusion according to such layout rules.

Other constraints in a FinFET process include a source/drain to well diode breakdown being lower than a desired programming voltage, very high gate-induced drain leakage (GIDL) leakage, and other sensitivities to the high voltages needed to program anti-fuse bitcells.

SUMMARY

A semiconductor memory, in accordance with one embodiment of the present disclosure, includes, in part, M×N select transistors disposed along M rows and N columns, wherein M and N are integers greater than or equal to 2; a first set of M wells each configured to be biased independently of the remaining M−1 wells and each having formed therein the N of the select transistors, wherein the N select transistors disposed in each well have a source/drain terminal coupled to the same bitline corresponding to a different one of M bitlines of the memory; and M×N anti-fuses, wherein each anti-fuse is associated and forms a bitcell with a corresponding one of the M×N select transistors.

In one embodiment, each of the select transistors is an n-channel metal-oxide semiconductor transistor and each of the first set of M wells is a p-well formed in an n-well of a p-type semiconductor substrate. In one embodiment, the anti-fuse associated with each select transistor is formed in the same p-well in which the select transistor is formed. In one embodiment, the gate oxide thickness of each select transistor is greater than the gate oxide thickness of each anti-fuse. In one embodiment, each anti-fuse is formed in the semiconductor substrate.

In one embodiment, the semiconductor memory further includes, in part, a second set of N p-wells each having formed therein M anti-fuses, wherein the M anti-fuses formed in each of the second set of N p-wells have terminals coupled to a different one of N common lines of the memory. In one embodiment, the semiconductor memory further includes, in part, a set of N n-wells each having formed therein M anti-fuses, wherein the M anti-fuses formed in each of the n-wells have terminals coupled to a different one of N common lines of the memory. In one embodiment, each anti-fuse may be an MOS transistor, a gate-to-interconnect, a gate-to-contact, and metal-to-metal structure.

A method of forming a memory device, in accordance with one embodiment of the present disclosure, includes, in part, disposing M×N select transistors along M rows and N columns, wherein M and N are integers greater than or equal to 2; forming a first set of M wells each configured to be biased independently of the remaining M−1 wells and each having formed therein N of the select transistors, wherein the N select transistors disposed in each well have a source/drain terminal coupled to a same bitline corresponding to a different one of M bitlines of the memory; and forming M×N anti-fuses. Each anti-fuse is associated and forms a bitcell with a corresponding one of the M×N select transistors.

In accordance with one embodiment of the present disclosure, a non-transitory computer readable medium comprises stored instructions, which when executed by a processor, cause the processor to generate data representative of a memory device. The memory device, includes, in part, M×N select transistors disposed along M rows and N columns, wherein M and N are integers greater than or equal to 2; a first set of M wells each configured to be biased independently of the remaining M−1 wells and each having formed therein the N of the select transistors, wherein the N select transistors disposed in each well have a source/drain terminal coupled to the same bitline corresponding to a different one of M bitlines of the memory; and M×N anti-fuses, wherein each anti-fuse is associated and forms a bitcell with a corresponding one of the M×N select transistors.

BRIEF DESCRIPTION OF THE DRAWINGS

The disclosure will be understood fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3 is a table showing the voltages applied during read and write operations of the OTP memory of FIG. 2, in accordance with one embodiment of the present disclosure.

FIG. 8 is a table showing the voltages applied during read and write operations of the OTP memory device of FIG. 7, in accordance with one embodiment of the present disclosure.

FIG. 11 is a table showing the voltages applied during read and write operations of the OTP memory of FIG. 10, in accordance with one embodiment of the present disclosure.

FIG. 13 is a table showing the voltages applied during read and write operations of the OTP memory of FIG. 12, in accordance with one embodiment of the present disclosure.

DETAILED DESCRIPTION

The voltage required to program (also referred to herein as the rupture voltage or Vrupt) the gate dielectric of an n-channel metal oxide semiconductor (NMOS) device so as to form a permanent low resistance link (also referred to as a filament) is often larger than the breakdown voltage (BV) of a diode formed between an N+ source/drain (SD) and a p-well (e.g., positively doped region of an n-type substrate, or a positively doped region formed in a negatively doped region of a p-type substrate, or a positively doped region in an epitaxial layer). The breakdown voltage prevents the use of a bitcell array that uses a core NMOS select device or anti-fuse, because in typical bitcells, during the programming, the gate of the anti-fuse is pulled to Vrupt. The anti-fuse is used to store a 0 or 1, and a select device is used as part of the decoding to access the bit stored in the select device's associated anti-fuse, or to prevent interference with reading or programming of another bit. As a result, all programmed anti-fuses in a column have their gates shorted. Thus, any previously ruptured fuse will be connected to the source/drain (S/D or SD) of the anti-fuse and the select device. In a manufacturing process that uses metal gates, there is a relatively small voltage drop across the filament of a ruptured anti-fuse. Accordingly, the S/D is pulled up to Vrupt, unless the SD/p-well (PW) diode BV is significantly about Vrupt, the anti-fuse line will be clamped to approximately the BV of the N+/PW diode.

Figure 1:
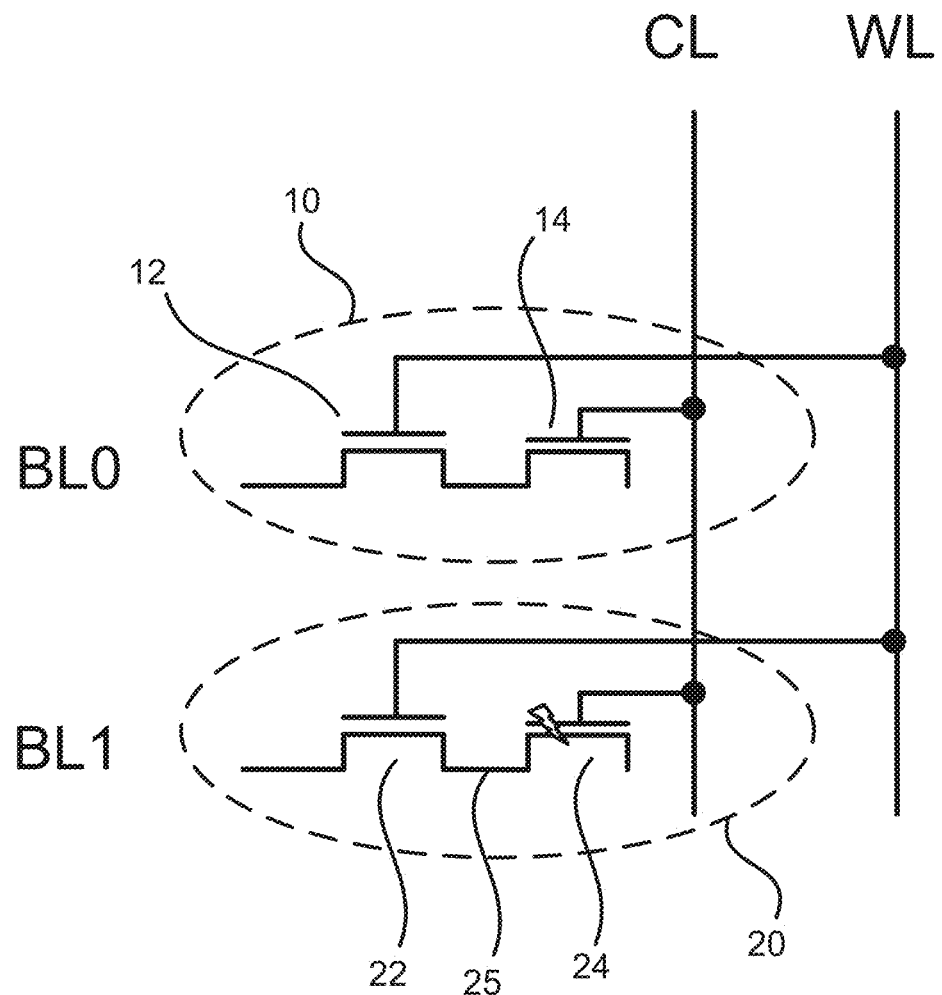
FIG. 1 is a schematic diagram of a pair of bitcells of an OTP memory device.

FIG. 1 is a schematic diagram of a pair of 2-transistor (2T) bitcells 10, 20 of an OTP memory device. Bitcell 10 is shown as including select transistor 12 and anti-fuse 14, and bitcell 20 is shown as including select transistor 22 and anti-fuse 24. The relatively high rupture voltage Vrupt is only applied to the common line CLs, i.e., the gates of anti-fuses.

To rupture anti-fuse 24, the selected CL is raised to Vrupt while the drain of anti-fuse 24 is held at the ground potential. Other bitcells (bits) that share the CL with the bit being programmed, will have their drains pulled up to a voltage designed to prevent any unintentional rupture. The problem occurs after one or more gates on a CL have been ruptured and an additional gate needs to be ruptured. If for example, anti-fuse 24 is ruptured earlier, when the CL is raised to Vrupt, all the previously ruptured gates, including anti-fuse 24, will pull the node 25 connecting the select device 22 (e.g., word line (WL)) and anti-fuse device 24 (e.g., CL) to Vrupt. The WL (e.g., applied to the gate of select device 22) will be at a voltage below Vrupt, therefore the node 25 between the WL and CL will rise to Vrupt. If, in the source/drain to well diode of transistor 22, the leakage at the node is too high at Vrupt, it will clamp the voltage on the CL and prevent additional anti-fuses from being programmed. For example, during the rupture of bitcell 10, if the rupture voltage Vrupt applied to the common line (CL) is greater than SD/well voltage, then the voltage of CL is clamped thus preventing bitcell 20 from being programmed.

Embodiments of the present disclosure overcome the aforementioned drawbacks by forming an OTP bitcell that can withstand a programming voltage above the breakdown voltage of the SD/well diode. In accordance with one embodiment, one or more isolated wells are formed in a semiconductor substrate to selectively increase the voltage applied to the wells where the source-drain (SD) is pulled to Vrupt. Embodiments of the present disclosure also reduce the gate-induced drain leakage (GIDL) on unselected bitcells during programming, thereby allowing for a large array (bank) of bitcells to be used. In the following, it is understood that the terms anti-fuse and fuse may be used interchangeably.

Embodiments of the present disclosure use isolated wells (e.g., p-wells) to enable select devices in a row to have different well voltages. During programming, the p-well and the gate of a select device not being programmed may both be raised. As a result, if an anti-fuse on an inhibited row (i.e., a row not selected to be programmed) is ruptured, the voltage on the junction is reduced to Vrupt–Vwell, where Vwell represents the voltage applied to the well. In one embodiment, Vwell may be the supply voltage VDD. Therefore, by raising the p-well voltage to VDD, the diode breakdown voltage is avoided.

Figure 2:
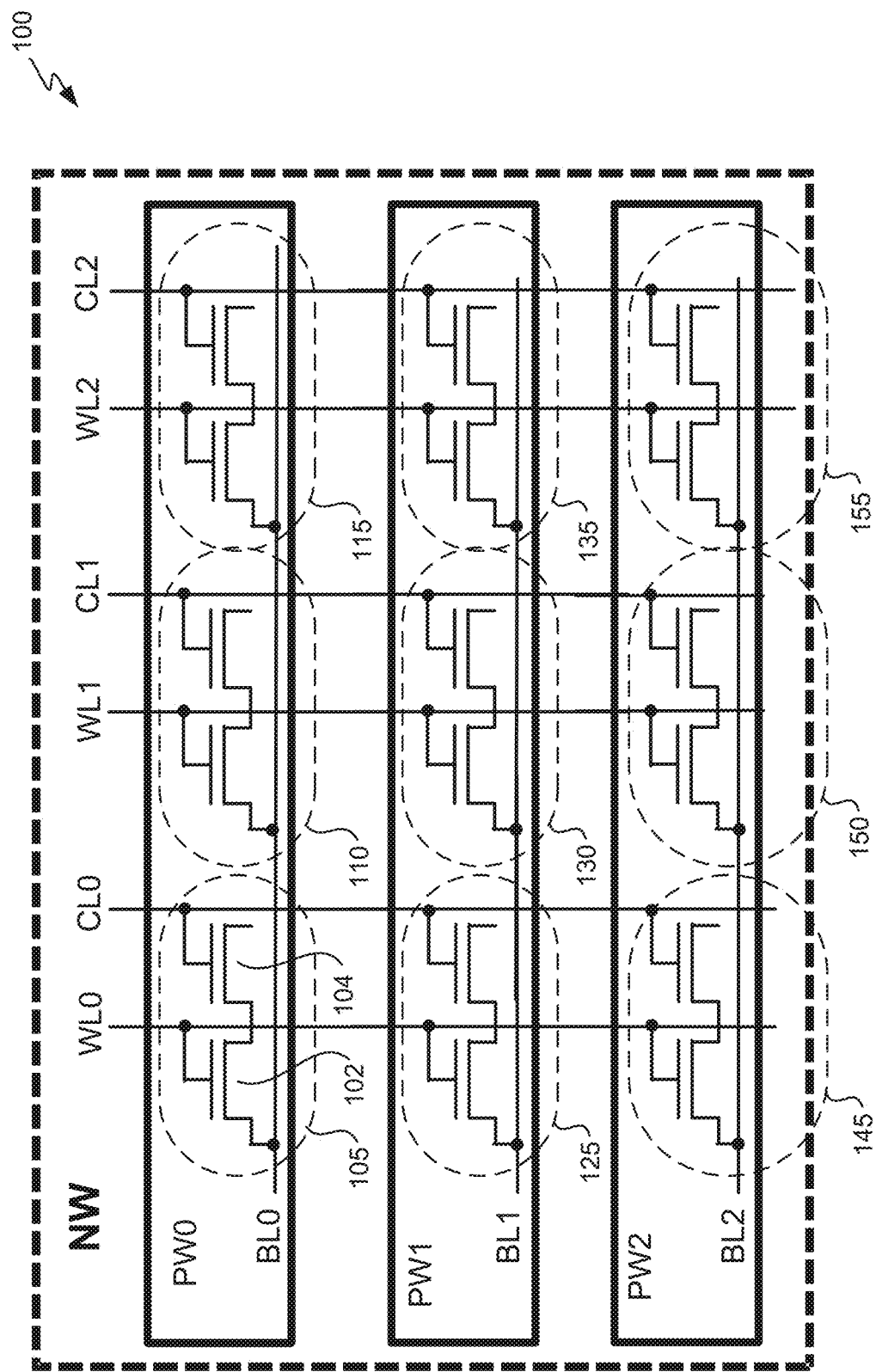
FIG. 2 is a schematic diagram of an OTP memory device, in accordance with one embodiment of the present disclosure.

FIG. 2 is an example of a 2-transistor OTP memory device 100, in accordance with one embodiment of the present disclosure. OTP memory device 100 is shown as including bitcells 105, 110, 115 formed in p-well PW0, bitcells 125, 130, 135 formed in p-well PW1, and bitcells 145, 150, 155 formed in p-well PW2. P-wells PW0, PW1, PW2 are formed in n-well (e.g., negatively doped region of a p-type substrate, or a negatively doped region formed in a positively doped region of an n-type substrate, or a positively doped region an epitaxial layer) NW, which in turn, is formed in a p-type substrate (not shown). P-wells PW0, PW1, PW2 are therefore isolated from one another. Although each p-well is shown as having three bitcells in this example, it is understood that each p-well may have more bitcells. Moreover, although OTP memory device 100 is shown as including only three p-wells, it is understood an OPT, in accordance with embodiments of the present disclosure, may have more than 3 p-wells. Each bitcell is shown as including a select transistor and an anti-fuse. For example, bitcell 105 is shown as including a select transistor 102 and an anti-fuse 104. Similarly, bitcell 155 is shown as including a select transistor 152 and an anti-fuse 154. Moreover, although OTP memory device 100 is shown as including 3 rows and 3 columns of bitcells forming a 3×3 array of bitcells (each row of the bitcells is formed in the same p-well), it is understood that an OTP memory device, in accordance with embodiments of the present disclosure, may have M rows and N columns of bitcells, where M and N are integers greater than or equal to 2.

The bitcells disposed in each p-well are shown as being connected to the same bitline. For example, bitcells 105, 110 and 115 are shown as being connected to the same bitline BL0, and bitcells 125, 130 and 135 are shown as being connected to the same bitline BL1. The gate terminals of the select transistors associated with bitcells 105, 125 and 145 are shown as being connected to the same wordline WL0. Similarly, the gate terminals of the select transistors associated with bitcells 110, 130 and 150 are shown as being connected to the same wordline WL1; and the gate terminals of the select transistors associated with bitcells 115, 135 and 155 are shown as being connected to the same wordline WL2.

The gate terminals of the anti-fuses associated with bitcells 105, 125 and 145 are shown as being connected to the same common line CL0. Similarly, the gate terminals of the anti-fuses associated with bitcells 110, 130 and 150 are shown as being connected to the same common line CL1; and the gate terminals of the anti-fuses associated with bitcells 115, 135 and 155 are shown as being connected to the same common line CL2.

FIG. 3 is a table showing the voltages applied during read and write (i.e., program or rupture) operations of OTP memory device 100, according to one embodiment of the present disclosure. Each read and program operation includes at least two bias conditions, one for the row being read or programmed (selected) and one for the rows that are unselected. Vinhibit refers to an intermediate voltage used to prevent damage to an anti-fuse and when programming (PROG) is not being performed. Vrupt refers to a high voltage used to rupture the gate oxide when a bitcell is being programmed, and VDD refers to the power supply voltage. In some embodiments, as described further below, Vrupt may be 4 volts, Vinhibit may be 1 volt, and VDD may be 0.75 volts.

Figure 4:
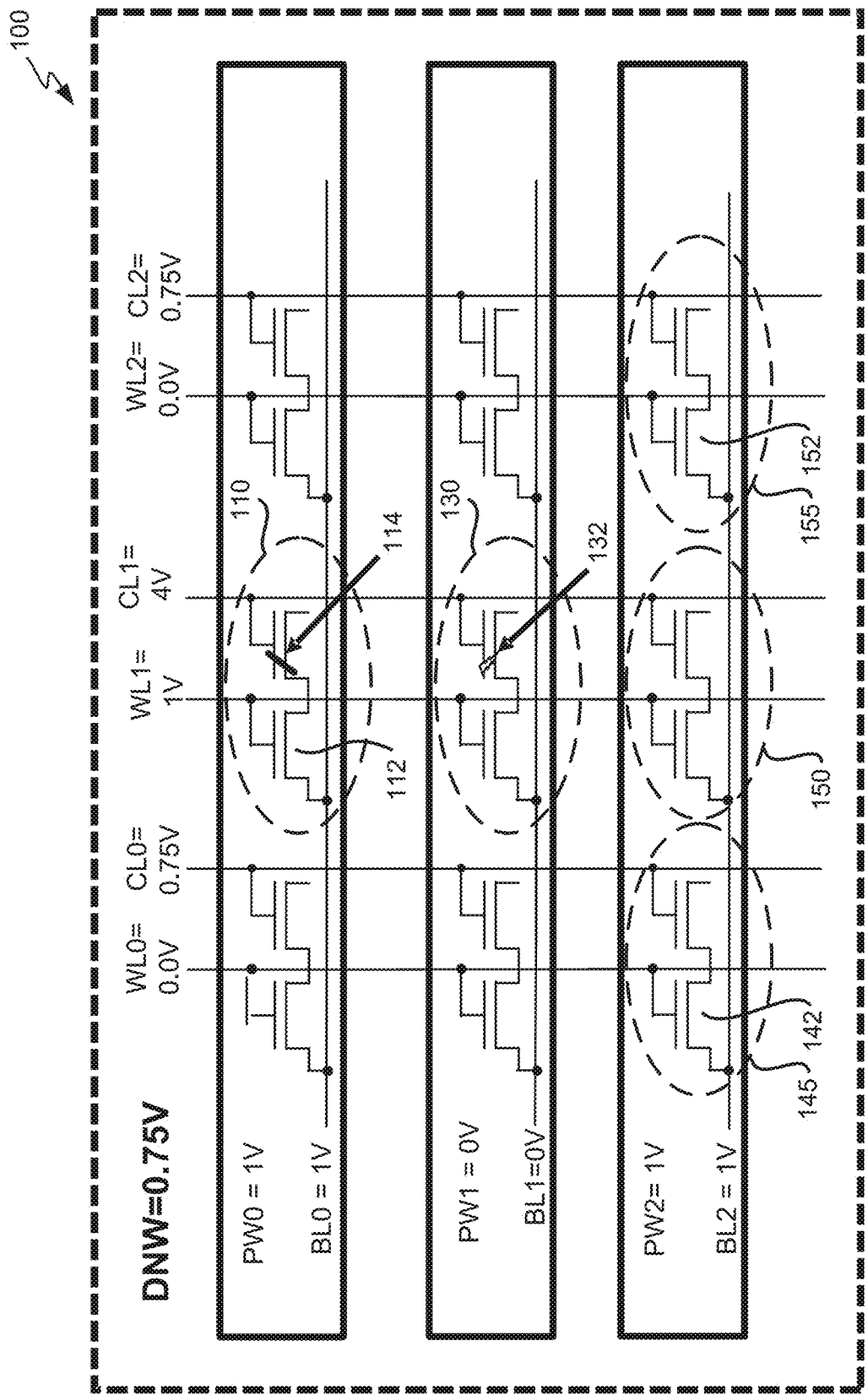
FIG. 4 shows the voltages applied to the OTP memory device of FIG. 2 during a programing cycle, in accordance with one embodiment of the present disclosure.

FIG. 4 shows OTP memory device 100 of FIG. 2 under different biasing conditions. Bitcell 110 is indicated as having been ruptured earlier as indicated by the arrow pointing to bitcell 110's associated anti-fuse 114. During the current cycle, it is desired to rupture bitcell 130 as indicated by the arrow pointing to bitcell 130's associated anti-fuse 132.

To rupture bitcell 130, in one embodiment, bitline BL1 is pulled to the ground potential, wordline WL1 is raised to, for example, to 1 volt, and common line CL1 is raised to Vrupt (e.g., 4 volts). Because anti-fuse 114 was ruptured earlier, it provides a relatively small resistance between its gate and channel regions. To prevent the diode formed between the source/drain and body of the anti-fuse 114 from entering a breakdown region, which in turn may cause significant leakage current to flow from CL1 to the diode's body and thereby either decrease the CL1 voltage or clamp it, the voltage of P-well PW0 is increased to a sufficiently large voltage that will inhibit the diode from reaching the breakdown voltage. For example, a supply voltage VDD of 0.75 volts may be applied to p-well PW0 to prevent the diode breakdown voltage.

Forming the bitcells in isolated p-wells, in accordance with embodiments of the present disclosure, also reduces the gate induced leakage voltage, as described further below. Referring to FIG. 4, bitcells 145, 150 and 155 are not selected to be ruptured when bitcell 130 is being ruptured. Therefore, the gate terminals of select transistors 142 and 152 (of bitcells 145 and 155 respectively) are maintained, for example, at the ground potential while bitline BL2 receives, for example, half the rupture voltage of 4 volts, when the source/drain to p-well diode breakdown voltage is assumed to be around 3.6 volts. If the select transistors are formed using a process designed to withstand, for example 0.75 volts across the transistors' gate-to-source terminals, increasing the voltage of bitline BL2 to, for example, an inhibit voltage of 1 volt when the gates of transistors 142 and 152 receive the ground potential, may induce gate-to-drain leakage current across these transistors. To reduce or eliminate such leakage current, p-well PW2 is biased to a suitable voltage. Accordingly, forming the bitcells in isolated p-wells, in accordance with embodiments of the present disclosure, not only eliminates the leakage current from the common lines receiving the rupture voltage, but also eliminates the leakage current on cells that are not selected for rupture. In the embodiment shown in FIG. 4, the bitlines and their associated p-wells are at the same voltage, thus eliminating any leakage current.

Figure 5:
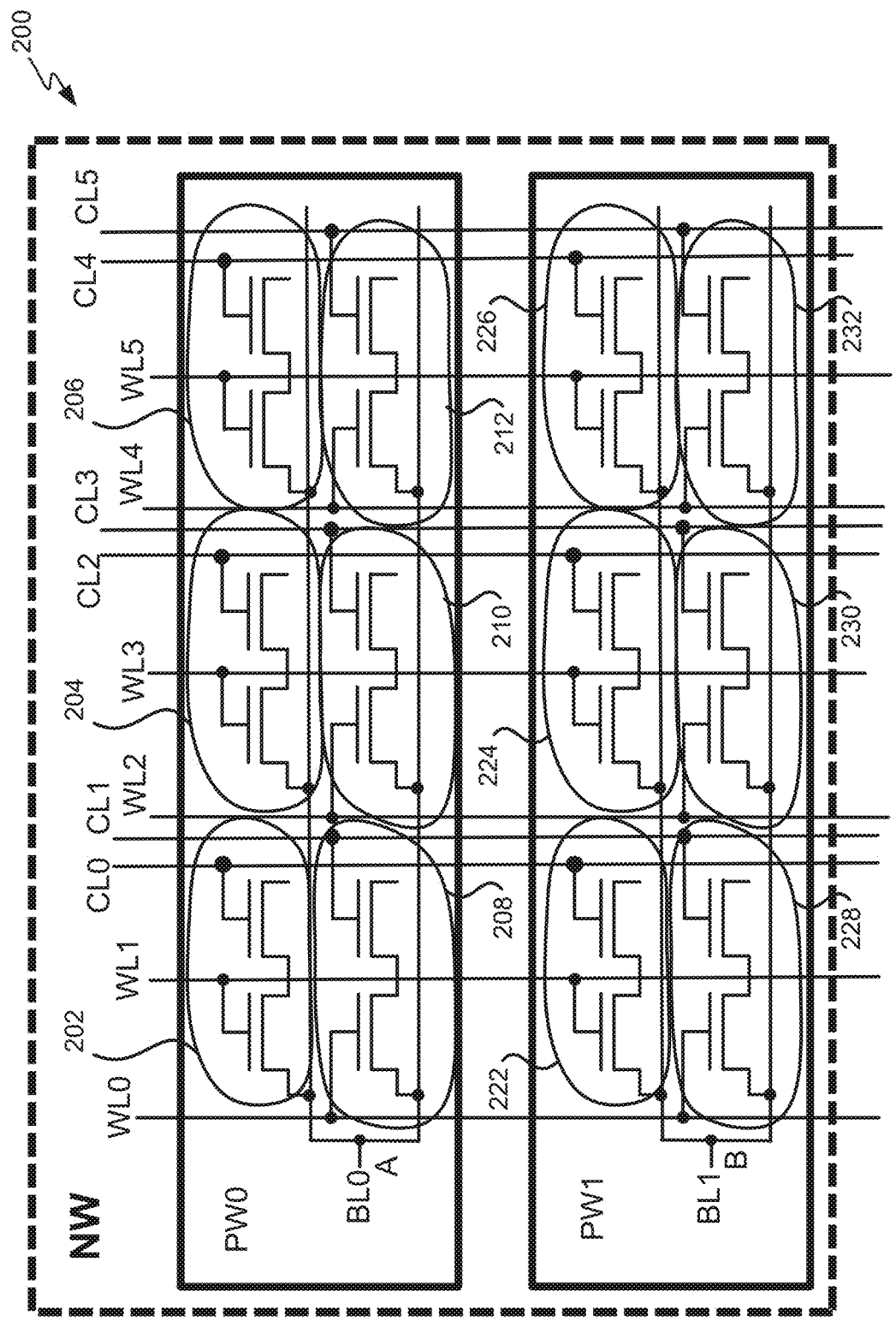
FIG. 5 is a schematic diagram of an OTP memory device, in accordance with one embodiment of the present disclosure.

FIG. 5 is a schematic diagram of an OPT memory device 200, in accordance with another embodiment of the present disclosure. OPT memory device 200 has a folded row relative to OPT 100 shown in FIG. 2. The bitcells connected to the same bitline (only two of which BL0 and Bl1 are shown in FIG. 5) are formed in the same isolated p-well. For example, the six bitcells 202, 204, 206, 208, 210, and 212 connected to bitline BL0 are formed in p-well PW0, and the six bitcells 222, 224, 226, 228, 230 and 232 connected to bitline Bl1 are formed in p-well PW2. The folding of the bitlines reduces the row size while requiring a wider p-well. Bitlines BL0 and Bl1 are shown as having been folded at points A and B, respectively. P-wells PW0 and PW1 are shown as having been formed in n-well NW.

Figure 6:
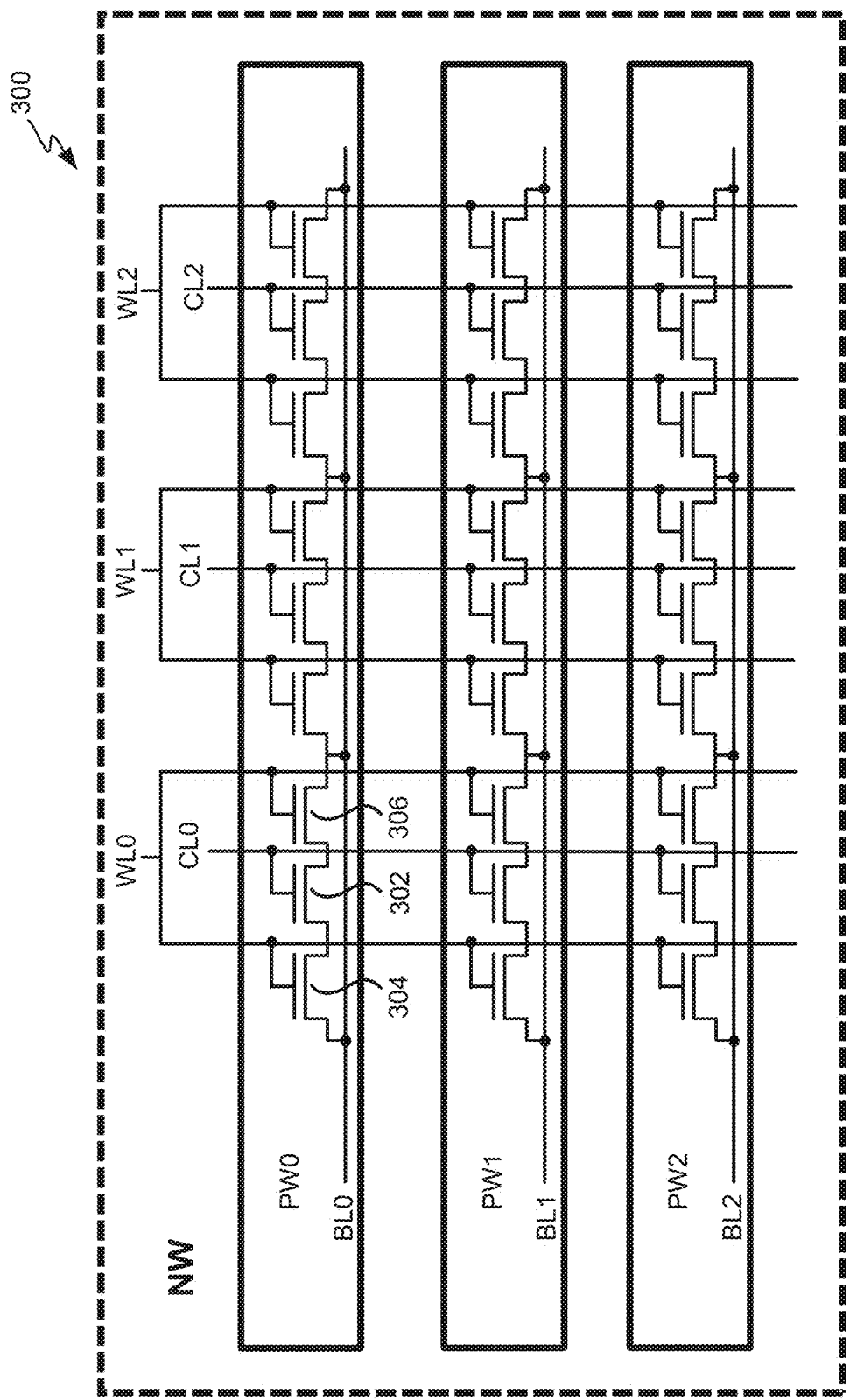
FIG. 6 is a schematic diagram of an OTP memory device, in accordance with one embodiment of the present disclosure.

FIG. 6 is a schematic diagram of an OPT memory device 300, in accordance with another embodiment of the present disclosure. In OPT memory 300, each anti-fuse, such as anti-fuse 302, is associated with a pair of select transistors each disposed on a different side of the anti-fuse. For example, anti-fuse 302 is associated with select transistors 304 and 306 both of which are shown as being coupled to wordline WL0. Accordingly, the effective select device has a size that is twice that of the select devices' associated anti-fuse. In OPT 600, the current from the anti-fuse is therefore enabled to flow in both directions to the bitline.

Figure 7:
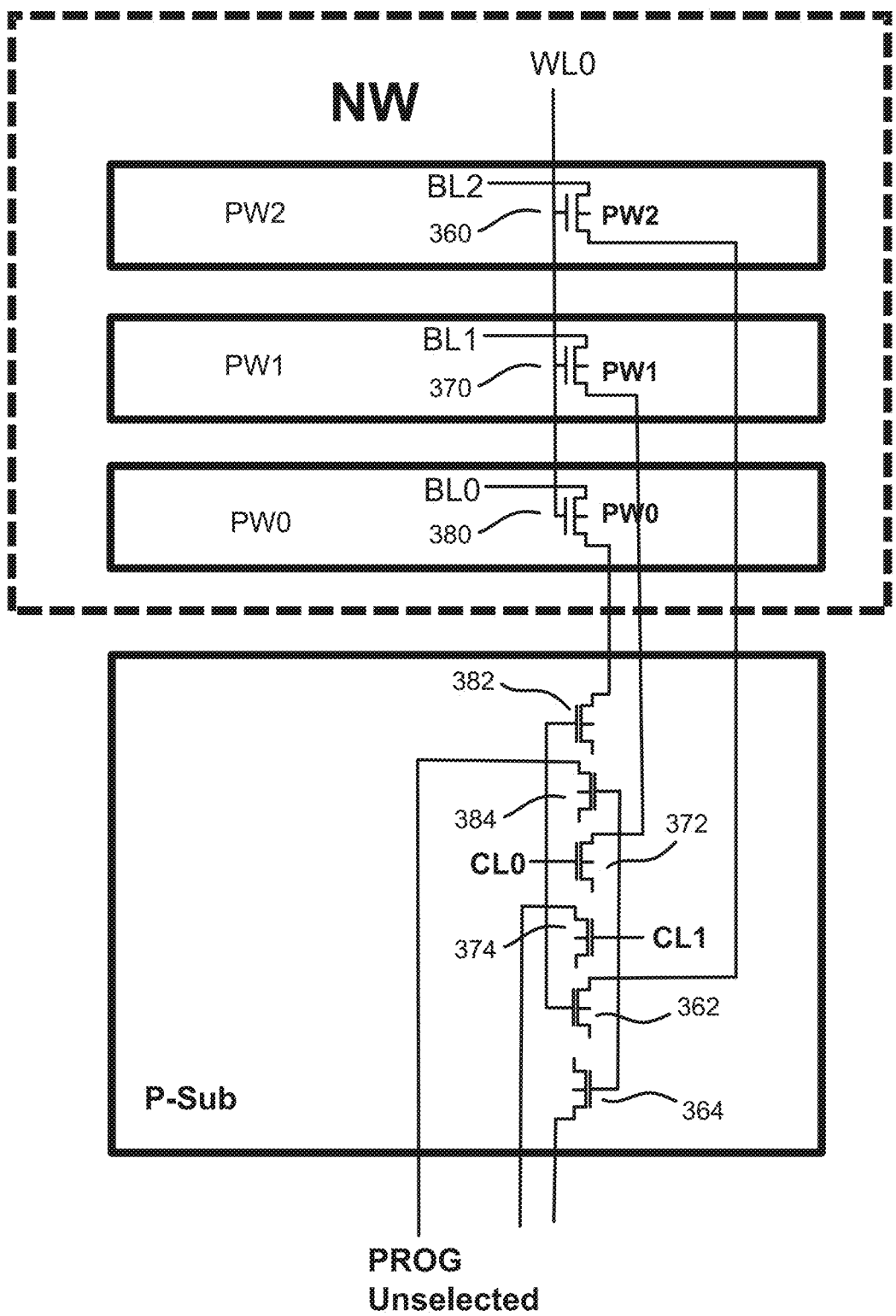
FIG. 7 is a schematic diagram of an OTP memory device, in accordance with one embodiment of the present disclosure.

FIG. 7 is a schematic diagram of an OPT memory device 350, in accordance with one embodiment of the present disclosure. In OPT memory device 350, the bitcell select transistors are input/output (IO) NMOS transistors that have a relatively thick gate oxide, and the anti-fuses are native NMOS transistors that have a relatively thinner gate oxide. The select transistors connected to different bitlines are formed in different isolated p-wells, and the native NMOS anti-fuses are shown as having been formed in the substrate, which may be a p-type substrate.

For example, select transistor 360 connected to bitline BL2 is formed in p-well PW2, select transistor 370 connected to bitline BL1 is formed in p-well PW1, and select transistor 380 connected to bitline BL0 is formed in p-well PW0. Although only 3 select transistors are shown in FIG. 7, it is understood that an OTP memory device, in accordance with embodiments of the present disclosure, often includes more select transistor—not shown in FIG. 7 for clarity. Similarly, although only 3 bitlines are shown in FIG. 7, it is understood that an OTP memory device, in accordance with embodiments of the present disclosure, often includes more bitlines that are not shown in FIG. 7. P-wells PW0, PW1, and PW2 are shown as being formed in n-well NW, which in turn, is formed in the p-type substrate.

Anti-fuse 362 and its associated select transistor 360 form a first bitcell; anti-fuse 372 and its associated select transistor 370 form a second bitcell; and anti-fuse 382 and its associated select transistor 380 form a third bitcell. The select transistors associated with anti-fuses 384, 374 and 364 are not shown in FIG. 7 for clarity. By interleaving the anti-fuses as shown in FIG. 7, punch though between N+ regions (i.e., source/drain regions) during a programming cycle is avoided.

FIG. 8 is a table showing the various voltages applied to perform read and write operations on OTP memory device 350, according to one embodiment of the present disclosure. Each read and program operation includes at least two bias conditions, one for the row being read or programmed (selected) and one for the rows that are unselected. Vinhibit refers to an intermediate voltage used to prevent punch-through and when programming (PROG) is not being performed. Vrupt refers to the high voltage used to rupture the gate oxide when a bitcell is being programmed, VDD refers to the core power supply voltage applied to anti-fuses, and VDDIO refers to the power supply voltage applied to the select transistors.

Figure 9:
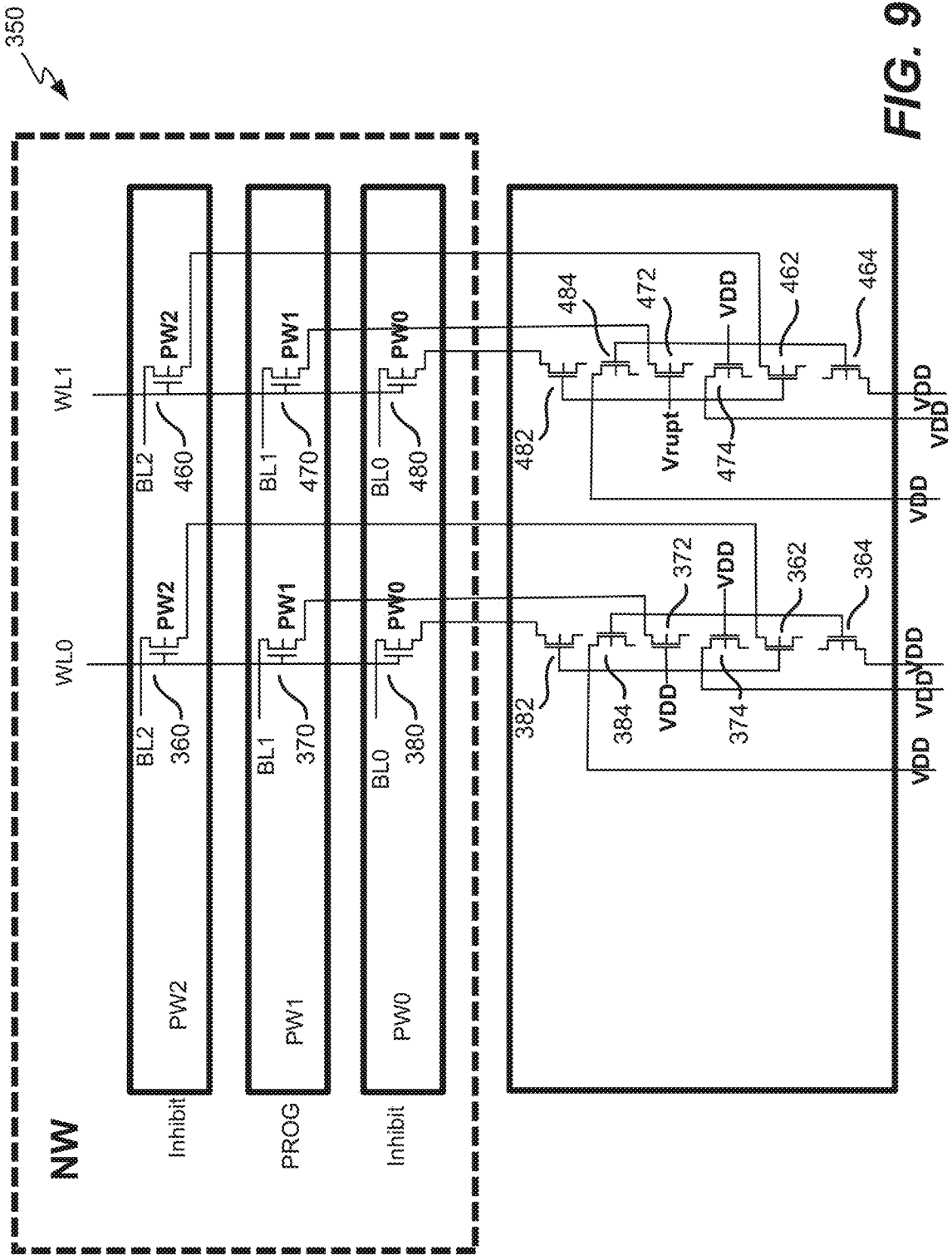
FIG. 9 shows the voltages applied to the OTP memory device of FIG. 8 during a programing cycle, in accordance with one embodiment of the present disclosure

FIG. 9 shows the OPT device 350 of FIG. 7 during a programming cycle. In FIG. 9 two of the wordlines of OPT 350, namely WL0 and WL1, are shown. Select transistor 460 connected to bitline BL2 is formed in p-well PW2; select transistor 470 connected to bitline BL1 is formed in p-well PW1; and select transistor 480 connected to bitline BL0 is formed in p-well PW0. Anti-fuse 462 and its associated select transistor 460 form a first bitcell; anti-fuse 472 and its associated select transistor 470 form a second bitcell; and anti-fuse 482 and its associated select transistor 480 form a third bitcell. The select transistors associated with anti-fuses 484, 474 and 464 are not shown in FIG. 7 for clarity. To program anti-fuse 472, voltage Vrupt is applied to the gate of anti-fuse 472, wordline WL1, which is connected to the gate terminal of anti-fuse 472's associated select transistor 470, is maintained at a voltage greater than Vinhibit, and bitline BL1 is held at the ground potential.

During the programming of anti-fuse 472, bitlines BL0 and Bl2 are maintained at voltage Vinhibit; wordline WL0, the gate voltages of unselected fuses, and p-wells PW0 and PW3 are maintained at supply voltage VDD, and p-well PW1, and bitline BL1 are maintained at the ground potential. The n-well NW, in which isolated p-wells PW0, PW1 and PW2 are formed, may be maintained at a voltage equal to or greater than the highest voltage of the p-wells. In some embodiments (not shown) additional p-wells may be formed in the vicinity of anti-fuses to provide further protection against N+ to N+ punch through.

In some embodiments, as described in detail above, the anti-fuses are MOS transistors, which may be NMOS or PMOS transistors. It is understood, however, that embodiments of the present disclosure equally apply to any other type of anti-fuses. For example, in some embodiments, the anti-fuses may be formed using the gate-to-local interconnect, gate-to-contact or metal-to metal structures.

Figure 10:
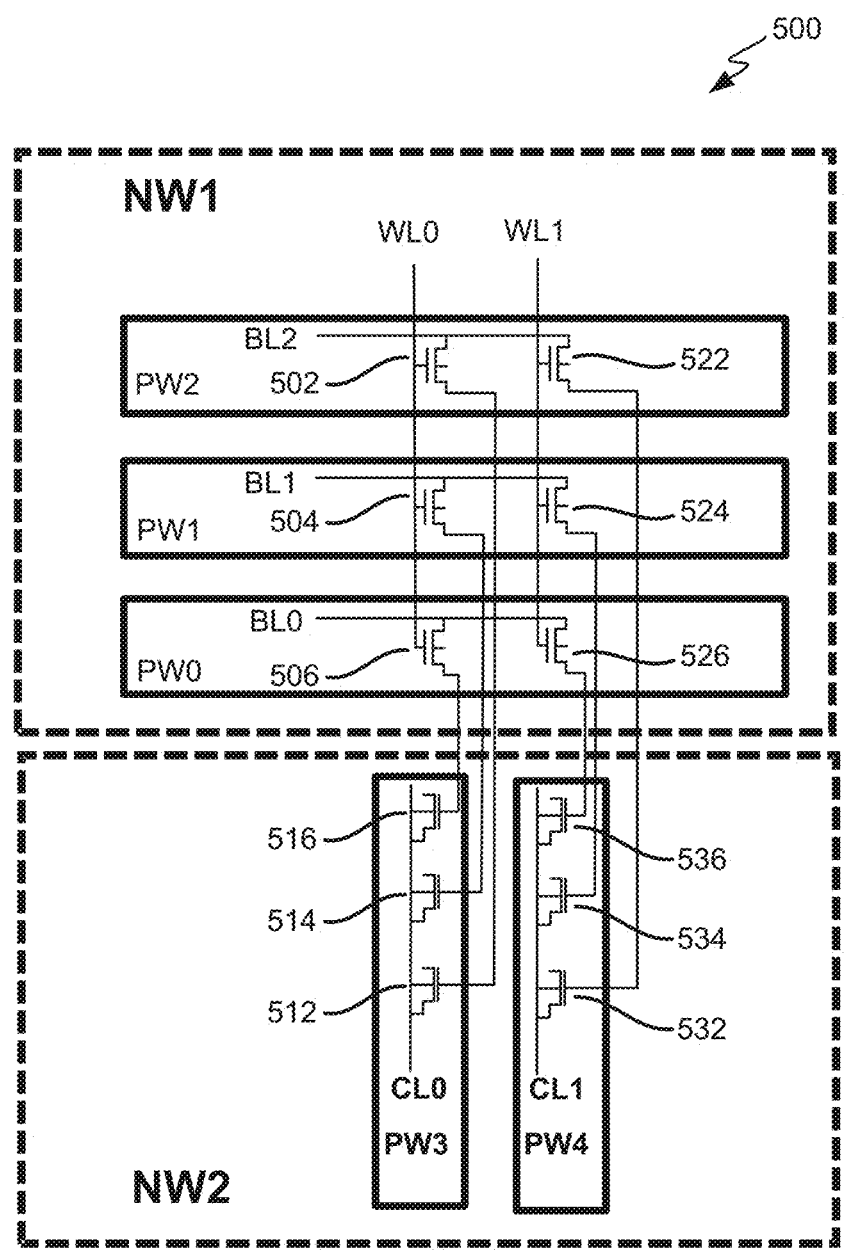
FIG. 10 is a schematic diagram of an OTP memory device, in accordance with one embodiment of the present disclosure.

In some embodiments, the anti-fuses are also formed in isolated wells. FIG. 10 shows an OPT memory device 500, in accordance with one embodiment of the present disclosure. Only two of the wordlines WL0 and WL1, three of the bitlines BL0, BL1, BL2, and two of the common lines CL0 and CL1 of OTP memory 500 are shown. Select transistor 502 and its associated anti-fuse 512 form a first bitcell; select transistor 504 and its associated anti-fuse 514 form a second bitcell; select transistor 506 and its associated anti-fuse 516 form a third bitcell; select transistor 522 and its associated anti-fuse 532 form a fourth bitcell; select transistor 524 and its associated anti-fuse 534 form fifth bitcell; and select transistor 526 and its associated anti-fuse 536 form a sixth bitcell.

Select transistors 502 and 522 connected to bitline BL2 are formed in a first p-well PW2; select transistors 504 and 524 connected to bitline BL1 are formed in a second p-well PW1; and select transistors 506 and 526 connected to bitline BL0 are formed in a third p-well PW0. P-wells PW0, PW1, and PW2 are formed in a first n-well NW and are shown as being parallel to one another. Furthermore, p-wells PW0, PW1, and PW2 are shown as extending along a direction that is parallel to that of the bitlines (i.e., the row direction). The isolated well coupled to the anti-fuses run parallel to the column direction.

Anti-fuses 516, 514 and 512 connected to common line CL0 are formed in a fourth p-well PW3; and anti-fuses 536, 534 and 532 connected to common line CL1 are formed in a fifth p-well PW4. P-wells PW3 and PW4 are formed in a second n-well NW2 and are shown as being parallel to one another. N-wells NW1 and NW2 may be formed in a p-type substrate and are shown as being parallel to one another. P-wells PW3 and PW4 are shown as extending a long a direction that is parallel to that of the common lines (column direction). Furthermore, p-wells PW0, PW1, and PW2 are shown as being substantially perpendicular to p-wells PW3 and PW4. The source and drain regions of the anti-fuses formed in each p-well are shorted to that p-well.

FIG. 11 is a table showing the various voltages applied during read and write operations of OTP memory device 500, according to one embodiment of the present disclosure. Each read and write operation includes at least two bias conditions, one for the row being read or programmed (selected) and one for the rows that are unselected. Vinhibit refers to an intermediate voltage used to prevent punch-through and when programming is not being performed. Vrupt refers to the relatively high voltage used to rupture the gate oxide when a bitcell is being programmed, VDD refers to the power supply voltage applied to anti-fuses, and VDDIO refers to the power supply voltage applied to the select transistors. In some embodiments, the source/drain regions of both the select transistors and the anti-fuses may include a lightly doped drain (LDD) region.

For example, to rupture anti-fuse 534, a rupture voltage Vrupt of, e.g., 4 volts may be applied to common line CL1, a VDDIO of, e.g., 1.8 volts is applied to wordline WL1, a VDD of, e.g., 0.75 volts is applied to wordline WL0, an inhibit voltage Vinhibit of, e.g., 1.2 volts is applied to bitlines BL2 and BL0, and bitline BL1 is maintained at the ground potential. Furthermore, p-wells PW2, PW0 and PW3, and n-well NW1 receive the VDD voltage, p-well PW1 receives the ground voltage, and p-well PW4 and n-well NW2 receive the voltage Vrupt. In one embodiment, the n-well associated with an anti-fuse being ruptured may be biased to a voltage lower than Vrupt.

Figure 12:
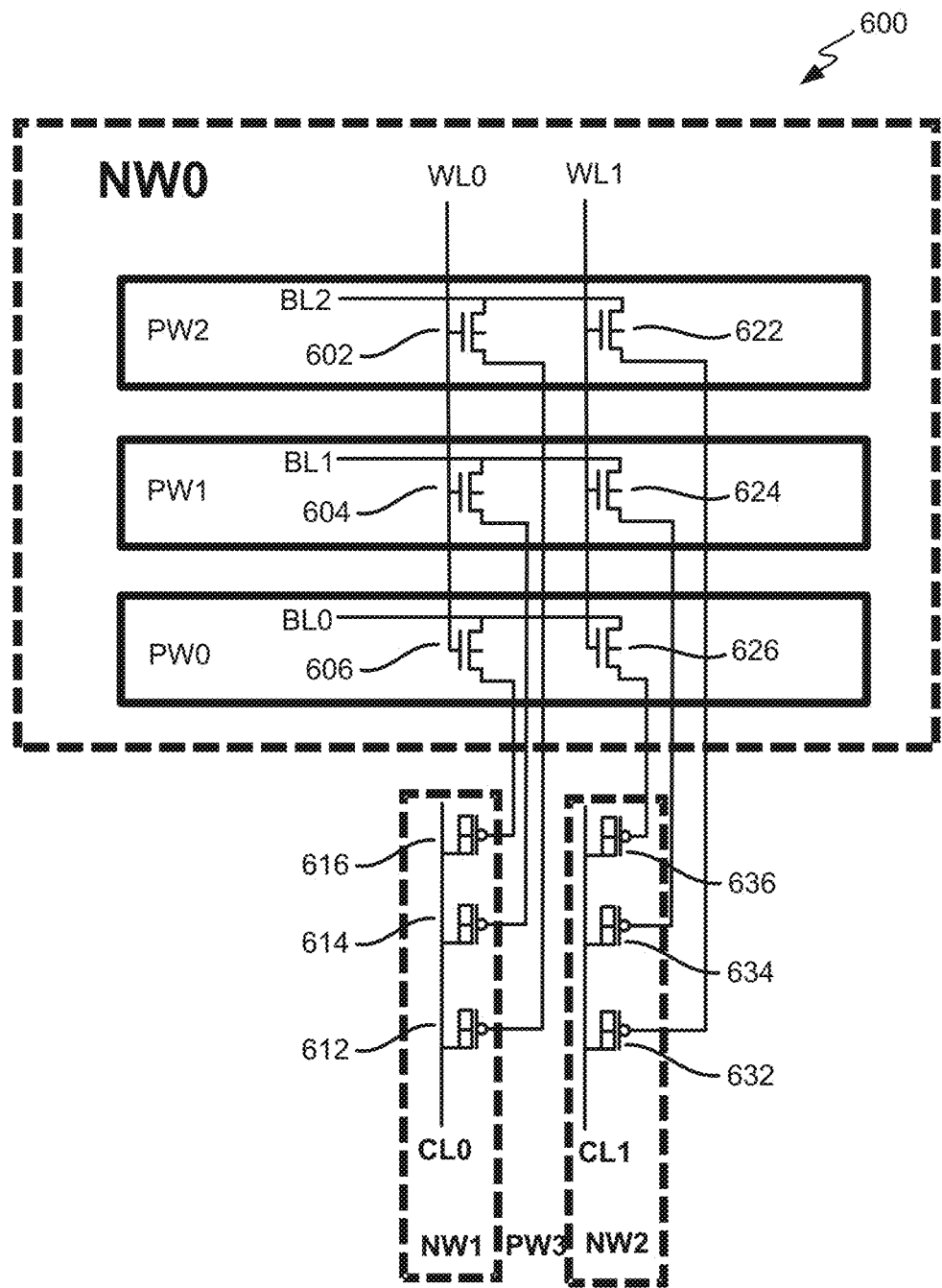
FIG. 12 is a schematic diagram of an OTP memory device, in accordance with one embodiment of the present disclosure.

In some embodiments, the anti-fuses are PMOS transistors formed in isolated n-wells. FIG. 12 shows an OPT device 600, in accordance with one embodiment of the present disclosure that include PMOS anti-fuses 612, 614, 616 formed in n-well NW1, and PMOS anti-fuses 622, 624, 626 formed in n-well NW2. Only two of the wordlines WL0 and WL1, three of the bitlines BL0, BL1, BL2, and two of the common lines CL0 and CL1 of OTP 600 are shown.

Select transistor 602 and its associated anti-fuse 612 form a first bitcell; select transistor 604 and its associated anti-fuse 614 form a second bitcell; select transistor 606 and its associated anti-fuse 616 form a third bitcell; select transistor 622 and its associated anti-fuse 632 form a fourth bitcell; select transistor 624 and its associated anti-fuse 634 form fifth bitcell; and select transistor 626 and its associated anti-fuse 636 form a sixth bitcell.

Select transistors 602 and 622 connected to bitline BL2 are formed in a first p-well PW2; select transistors 604 and 624 connected to bitline BL1 are formed in a second p-well PW1; and select transistors 606 and 626 connected to bitline BL0 are formed in a third p-well PW0. P-wells PW0, PW1, and PW2 are formed in a first n-well NW0 and are shown as being parallel to one another. Furthermore, p-wells PW0, PW1, and PW2 are shown as extending a long a direction that is parallel to that of the Bitlines (i.e., the row direction).

Anti-fuses 616, 614 and 612 connected to common line CL0 are formed in a first n-well NW1; and anti-fuses 636, 634 and 632 connected to common line CL1 are formed in a second n-well NW2. N-wells NW1 and NW2 may be formed in a fourth p-well PW3 and are shown as being parallel to one another. N-wells NW1 and NW2 are shown as extending along a direction that is parallel to that of the common lines (column direction). Furthermore, p-wells PW0, PW1, and PW2 are shown as being substantially perpendicular to n-wells NW1 and NW2. The source drain regions of the anti-fuses formed in each n-well may be shorted to that n-well.

FIG. 13 is a table showing the various voltages applied to perform read and write operations on OTP memory device 600, according to one embodiment of the present disclosure. Each read and write operation includes at least two bias conditions, one for the row being read or programmed (selected) and one for the rows that are unselected. Vinhibit refers to an intermediate voltage used to prevent punch-through and when programming is not being performed. Vrupt refers to high voltage used to rupture the gate oxide when a bitcell is being programmed, VDD refers to the power supply voltage applied to anti-fuses, and VDDIO refers to the power supply voltage applied to the select transistors. Although not shown, in some embodiments, the select transistors may be also PMOS transistors. In some embodiments, the select and anti-fuses may be formed in a silicon-on-insulator (SOI) substrate.

Figure 14:
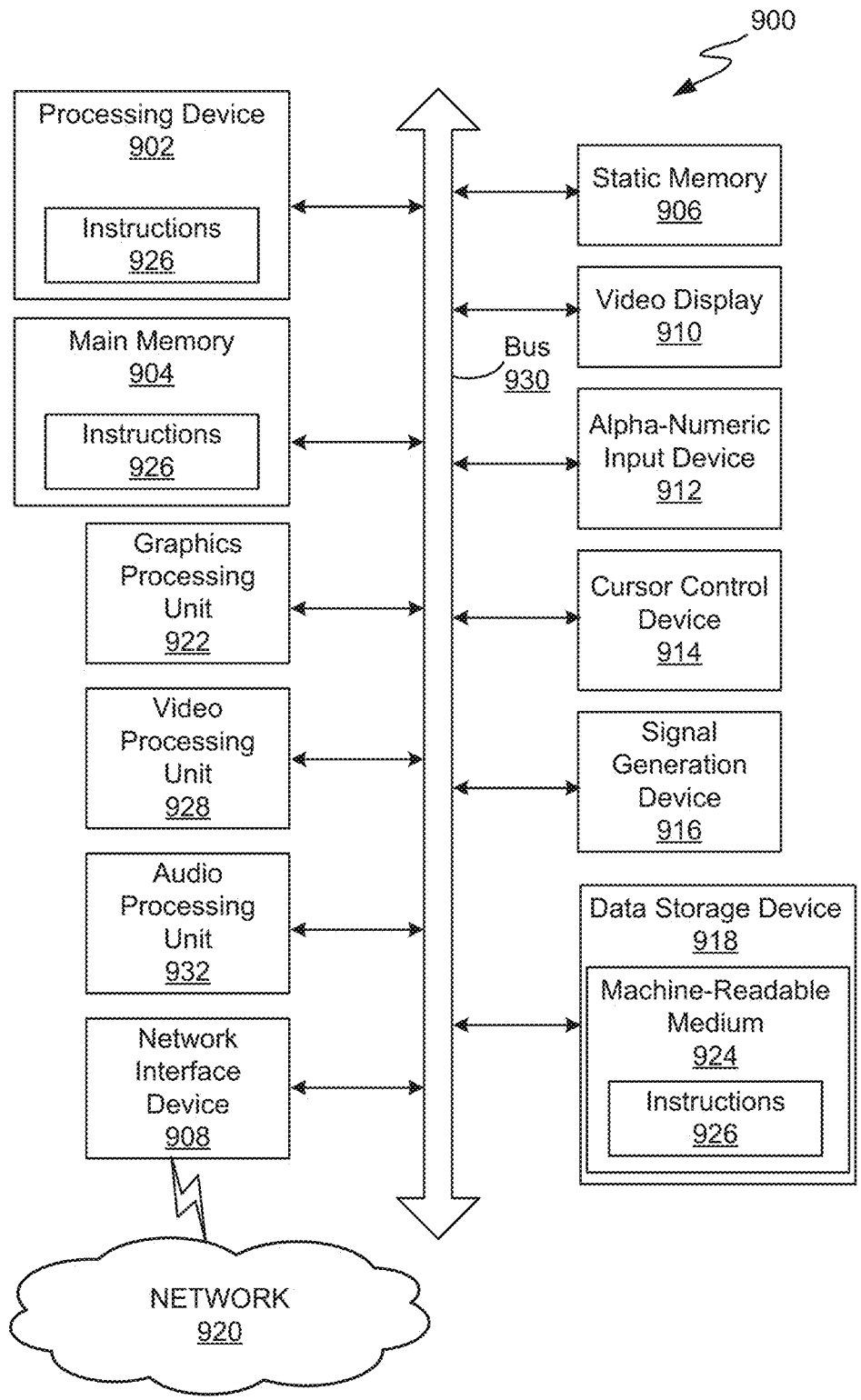
FIG. 14 depicts a diagram of an example computer system in which embodiments of the present disclosure may operate.

FIG. 14 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A semiconductor memory comprising:
   M×N select transistors disposed along M rows and N columns, wherein M and N are integers greater than or equal to 2;
   a first set of M wells each configured to be biased independently of a remaining M−1 wells and each having formed therein the N of the select transistors, wherein the N select transistors disposed in each well have a source/drain terminal coupled to a same bitline corresponding to a different one of M bitlines of the memory; and
   M×N anti-fuses, each anti-fuse being associated and forming a bitcell with a corresponding one of the M×N select transistors.

2. The semiconductor memory of claim 1 wherein each of the select transistors is an n-channel metal-oxide semiconductor transistor and each of the first set of M wells is a p-well formed in an n-well of a p-type semiconductor substrate.

3. The semiconductor memory of claim 2 wherein the anti-fuse associated with each select transistor is formed in a same p-well in which the select transistor is formed.

4. The semiconductor memory of claim 2 wherein a gate oxide thickness of each select transistor is greater than a gate oxide thickness of each anti-fuse, and wherein each anti-fuse is formed in the semiconductor substrate.

5. The semiconductor memory of claim 2 further comprising:
   a second set of N p-wells each having formed therein M anti-fuses, wherein the M anti-fuses formed in each of the second set of N p-wells have terminals coupled to a different one of N common lines of the memory.

6. The semiconductor memory of claim 2 further comprising:
   a set of N n-wells each having formed therein M anti-fuses, wherein the M anti-fuses formed in each of the n-wells have terminals coupled to a different one of N common lines of the memory.

7. The semiconductor memory of claim 1 wherein each anti-fuse comprises one or more of an MOS transistor, a gate-to-interconnect, gate-to-contact, and metal-to-metal structure.

8. The semiconductor memory of claim 2, wherein to program a first one of the M×N fuses, a first voltage is applied to a common line coupled to the first fuse, a second voltage that is smaller than the first voltage is applied to a wordline associated with the first fuse, and a ground potential is applied to the bitline coupled to the first fuse as well as to the p-well in which the first fuse is formed.

9. A method of forming a memory device, the method comprising:
   disposing M×N select transistors along M rows and N columns, wherein M and N are integers greater than or equal to 2;
   forming a first set of M wells each configured to be biased independently of a remaining M−1 wells and each having formed therein N of the select transistors, wherein the N select transistors disposed in each well have a source/drain terminal coupled to a same bitline corresponding to a different one of M bitlines of the memory; and
   forming M×N anti-fuses, each anti-fuse being associated and forming a bitcell with a corresponding one of the M×N select transistors.

10. The method of claim 9 wherein each of the select transistors is an n-channel MOS transistor and each of the first set of M wells is a p-well formed in an n-well of a p-type semiconductor substrate.

11. The method of claim 10 wherein the anti-fuse associated with each select transistor is formed in the same the p-well in which the select transistor is formed.

12. The method of claim 10 wherein a gate oxide thickness of each select transistor is greater than a gate oxide thickness of each anti-fuse, and wherein each anti-fuse is formed in the semiconductor substrate.

13. The method of claim 10 further comprising:

forming a second set of N p-wells each having formed therein M anti-fuses, wherein the M anti-fuses formed in each of the second set of N p-wells have terminals coupled to a different one of N common lines of the memory.

14. The method of claim 10 further comprising:

forming a set of N n-wells each having formed therein M anti-fuses, wherein the M anti-fuses formed in each of the n-wells have terminals coupled to a different one of N common lines of the memory.

15. The method of claim 9 wherein each anti-fuse comprises one or more of an MOS transistor, a gate-to-interconnect, and metal-to-metal structure.

16. The method of claim 10, wherein to program a first one of the M×N fuses, a first voltage is applied to a common line coupled to the first fuse, a second voltage that is smaller than the first voltage is applied to a wordline associated with the first fuse, and a ground potential is applied to the bitline coupled to the first fuse as well as to the p-well in which the first fuse is formed.

17. A non-transitory computer readable medium comprising stored instructions, which when executed by a processor, cause the processor to generate data representative of a memory device, wherein the memory device comprises:

M×N select transistors disposed along M rows and N columns, wherein M and N are integers greater than or equal to 2;

a first set of M wells each configured to be biased independently of a remaining M−1 wells and each having formed therein N of the select transistors, wherein the N select transistors disposed in each well have a source/drain terminal coupled to a same bitline corresponding to a different one of M bitlines of the memory; and M×N anti-fuses, each anti-fuse being associated and forming a bitcell with a corresponding one of the M×N select transistors.

18. The non-transitory computer readable medium of claim 17 wherein each of the select transistors is an n-channel MOS transistor and each of the first set of M wells is a p-well formed in an n-well of a p-type semiconductor substrate.

19. The non-transitory computer readable medium of claim 17 wherein each of the select transistors is an n-channel MOS transistor and each of the first set of M wells is a p-well formed in an n-well of a p-type semiconductor substrate.

20. The non-transitory computer readable medium of claim 17 wherein a gate oxide thickness of each select transistor is greater than a gate oxide thickness of each anti-fuse, and wherein each anti-fuse is formed in the semiconductor substrate.

\* \* \* \* \*